(12) United States Patent
Kim et al.

(10) Patent No.: US 8,957,583 B2
(45) Date of Patent: Feb. 17, 2015

(54) METHOD OF FABRICATING ORGANIC LIGHT-EMITTING DISPLAY AND ORGANIC LIGHT-EMITTING DISPLAY FABRICATED BY THE METHOD

(75) Inventors: Jin-Kwang Kim, Yongin (KR);
Sang-Joon Seo, Yongin (KR);
Seung-Hun Kim, Yongin (KR);
Jun-Hyuk Cheon, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 365 days.

(21) Appl. No.: 13/297,586

(22) Filed: Nov. 16, 2011

(65) Prior Publication Data
US 2012/0242221 A1   Sep. 27, 2012

(30) Foreign Application Priority Data
Mar. 21, 2011   (KR) .................. 10-2011-0024961

(51) Int. Cl.
*H01J 1/62*     (2006.01)
*H01J 63/04*    (2006.01)
*H01L 51/52*    (2006.01)

(52) U.S. Cl.
CPC .................. *H01L 51/5253* (2013.01)
USPC .............. 313/512; 313/504; 313/506; 445/24

(58) Field of Classification Search
CPC . H01L 51/52; H01L 2227/326; H01L 27/322; H01L 51/5237; H01L 2251/5315; H01L 51/5253; H01L 2251/566

USPC ................ 445/23–25; 313/498–512
See application file for complete search history.

(56) References Cited

U.S. PATENT DOCUMENTS

| | | | | |
|---|---|---|---|---|
| 7,648,925 B2* | 1/2010 | Moro et al. | ................... | 438/780 |
| 7,767,498 B2* | 8/2010 | Moro et al. | ................... | 438/126 |
| 8,633,585 B2* | 1/2014 | Schmid et al. | ............... | 257/729 |
| 2001/0052752 A1* | 12/2001 | Ghosh et al. | ................. | 313/512 |
| 2004/0247949 A1* | 12/2004 | Akedo et al. | ................. | 428/704 |
| 2006/0006798 A1* | 1/2006 | Buckley | ....................... | 313/512 |
| 2006/0246811 A1* | 11/2006 | Winters et al. | ................. | 445/25 |
| 2008/0164808 A1* | 7/2008 | Kim et al. | ..................... | 313/504 |
| 2009/0191781 A1* | 7/2009 | Ishida et al. | .................... | 445/24 |
| 2010/0178481 A1* | 7/2010 | George et al. | ................. | 428/213 |
| 2010/0213828 A1* | 8/2010 | Seo et al. | ...................... | 313/504 |
| 2011/0052836 A1* | 3/2011 | Kim et al. | ..................... | 428/1.1 |
| 2011/0121354 A1* | 5/2011 | Schmid et al. | ............... | 257/100 |
| 2011/0290551 A1* | 12/2011 | Lee | .............................. | 174/520 |

FOREIGN PATENT DOCUMENTS

| | | |
|---|---|---|
| KR | 10-2008-0009528 A | 1/2008 |
| KR | 10-2009-0099140 A | 9/2009 |
| KR | 10-2010-0097514 A | 9/2010 |

\* cited by examiner

*Primary Examiner* — Anh Mai
*Assistant Examiner* — Kevin Quarterman
(74) *Attorney, Agent, or Firm* — Lee & Morse, P.C.

(57) ABSTRACT

A method of fabricating an organic light-emitting display includes forming an organic light-emitting device (OLED) on a substrate, forming a first encapsulation layer, which has a first thin-film density and contains a first inorganic material, on the substrate, and forming a second encapsulation layer, which has a second thin-film density higher than the first thin-film density and contains a second inorganic material, on the first encapsulation layer.

18 Claims, 5 Drawing Sheets

METHOD OF FABRICATING ORGANIC LIGHT-EMITTING DISPLAY AND ORGANIC LIGHT-EMITTING DISPLAY FABRICATED BY THE METHOD

BACKGROUND OF THE INVENTION

1. Field of the Invention

Embodiments described herein relate to a method of fabricating an organic light-emitting display and an organic light-emitting display fabricated by the method.

2. Description of the Related Art

Light-emitting devices are self-emitting devices that have a wide viewing angle, good contrast, and a rapid response time. Light-emitting devices are classified into inorganic light-emitting devices, which include an emitting layer formed of an inorganic compound, and organic light-emitting devices (OLED) which include an emitting layer formed of an organic compound. OLEDs exhibit better luminance, driving voltage and response speed characteristics and can produce polychromatic light, compared to inorganic light-emitting devices. Due to these advantages, extensive research into OLEDs has been conducted.

Generally, OLEDs have a stacked structure of an anode/an organic light-emitting layer/a cathode. OLEDs may also have various structures such as anode/hole injection layer/hole transport layer/emitting layer/electron transport layer/electron injection layer/cathode or anode/hole injection layer/hole transport layer/emitting layer/hole blocking layer/electron transport layer/electron injection layer/cathode.

SUMMARY OF THE INVENTION

According to an embodiment, there is provided a method of fabricating an organic light-emitting display including forming an organic light-emitting device (OLED) on a substrate, forming a first encapsulation layer, which has a first thin-film density and contains a first inorganic material, on the substrate, and forming a second encapsulation layer, which has a second thin-film density higher than the first thin-film density and contains a second inorganic material, on the first encapsulation layer.

The first inorganic material and the second inorganic material may be the same material.

The first encapsulation layer and the second encapsulation layer may be formed within the same equipment.

The first encapsulation layer and the second encapsulation layer may be formed by an atomic layer deposition (ALD) method.

The first encapsulation layer may be formed by an ALD method using a first plasma generated based on a first energy, and the second encapsulation layer is formed by an ALD method using a second plasma generated based on a second energy that is higher than the first energy.

The first plasma may be generated using a first power at a first level, and the second plasma is generated using a second power at a second level that is higher than the first level.

The first plasma may be generated using a first power of a first frequency, and the second plasma is generated using a second power of a second frequency which is higher than the first frequency.

The first encapsulation layer may be formed by an ALD method using remote plasma, and the second encapsulation layer is formed using remote plasma or direct plasma.

The method may further include forming a stress release layer between the first encapsulation layer and the second encapsulation layer.

The stress release layer may be formed by a molecular layer deposition (MLD) method.

The first thin-film density or the second thin-film density may increase as a distance from the OLED increases.

According to another embodiment, there is provided a method of fabricating an organic light-emitting display, including placing a substrate having an OLED in a chamber, and successively forming a first encapsulation layer and a second encapsulation layer on the OLED, wherein the first encapsulation layer is formed by an ALD method using a first plasma generated based on a first energy, and the second encapsulation layer is formed by an ALD method using a second plasma generated based on a second energy that is different from the first energy.

The first encapsulation layer and the second encapsulation layer may be made of the same material.

The first encapsulation layer and the second encapsulation layer may be formed by an ALD method using a remote plasma.

According to another embodiment, there is provided an organic light-emitting display including a substrate having an OLED, a first encapsulation layer on the substrate, having a first thin-film density, and containing a first inorganic material, and a second encapsulation layer on the first encapsulation layer, the second encapsulation layer having a second thin-film density which is higher than the first thin-film density, and containing a second inorganic material.

The first inorganic material and the second inorganic material may be the same material.

The display may further include a stress release layer between the first encapsulation layer and the second encapsulation layer.

The first thin-film density may increase as a distance from the OLED increases.

BRIEF DESCRIPTION OF THE DRAWINGS

The above and other aspects and features will become more apparent by describing in detail exemplary embodiments thereof with reference to the attached drawings, in which.

DETAILED DESCRIPTION OF THE INVENTION

This application claims priority from Korean Patent Application No. 10-2011-0024961, filed on Mar. 21, 2011, in the Korean Intellectual Property Office, the disclosure of which is incorporated herein by reference in its entirety.

Advantages and features and methods of accomplishing the same may be understood more readily by reference to the following detailed description of exemplary embodiments and the accompanying drawings. Various aspects may, however, be embodied in many different forms and should not be construed as being limited to the embodiments set forth herein. Rather, these embodiments are provided so that this disclosure will be thorough and complete and will fully convey the subject matter to those skilled in the art, and the subject matter will only be defined by the appended claims. In the drawings, sizes and relative sizes of elements may be exaggerated for clarity.

Like reference numerals refer to like elements throughout the specification. As used herein, the term "and/or" includes any and all combinations of one or more of the associated listed items.

The terminology used herein is for the purpose of describing particular embodiments only and is not intended to be limiting of the invention. As used herein, the singular forms are intended to include the plural forms as well, unless the context clearly indicates otherwise. It will be further understood that the terms "comprises" and/or "made of," when used in this specification, specify the presence of stated components, steps, operations, and/or elements, but do not preclude the presence or addition of one or more other components, steps, operations, elements, and/or groups thereof It will be understood that, although the terms first, second, third, etc., may be used herein to describe various elements, these elements should not be limited by these terms. These terms are only used to distinguish one element from another element. Thus, a first element discussed below could be termed a second element without departing from the teachings Embodiments of the invention are described herein with reference to plan and cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
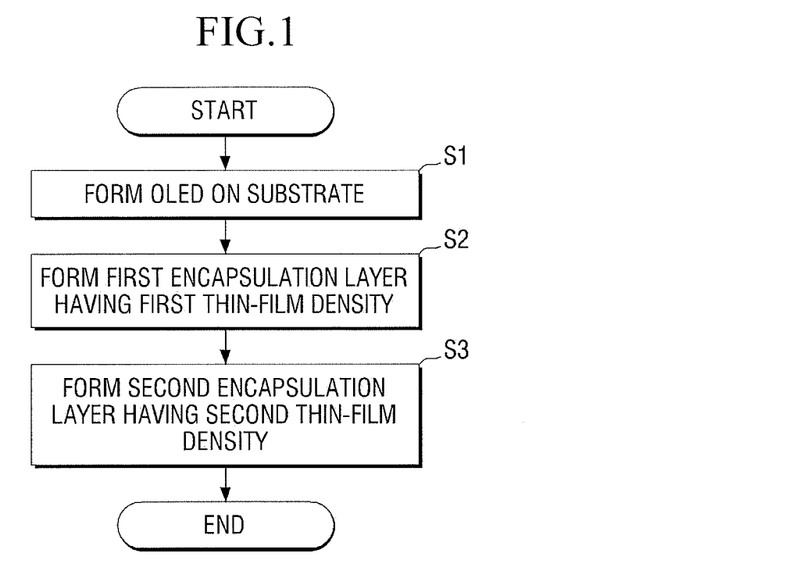
FIG. 1 is a flowchart illustrating a method of fabricating an organic light-emitting display according to an exemplary embodiment.
Figure 2:
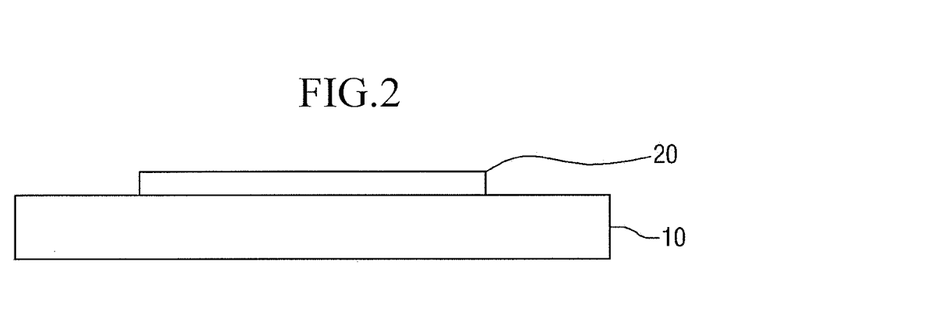
FIGS. 2 through 4 are cross-sectional views illustrating intermediate processes of the fabrication method of FIG. 1.
Figure 3:
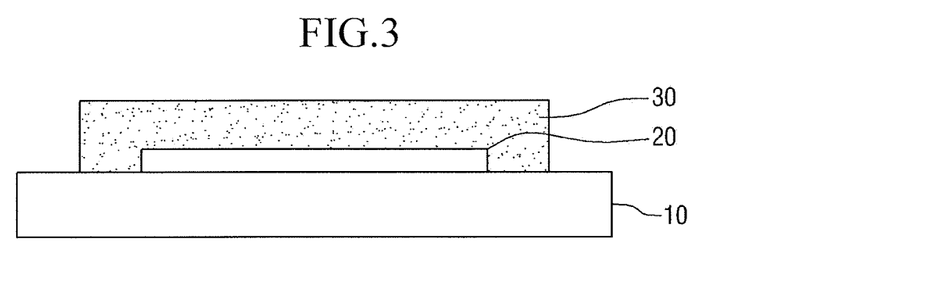
Figure 4:
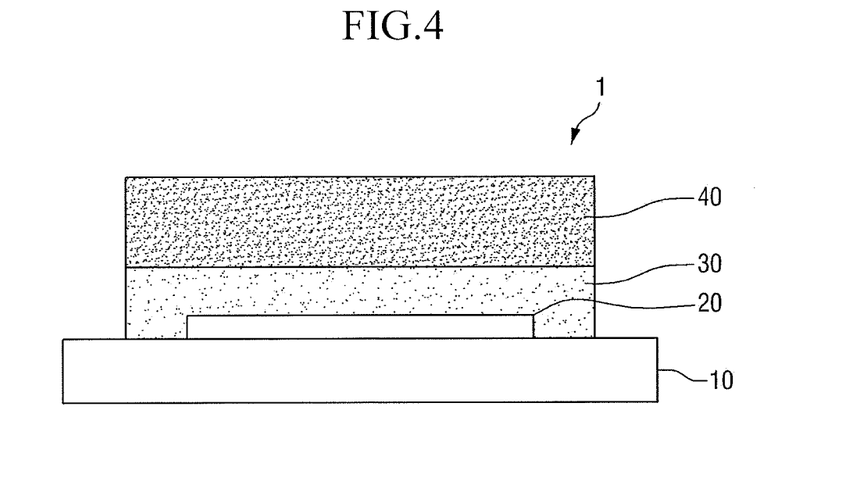

FIG. 1 is a flowchart illustrating a method of fabricating an organic light-emitting display according to an exemplary embodiment. FIGS. 2 through 4 are cross-sectional views illustrating intermediate processes of the fabrication method of FIG. 1.

Referring to FIGS. 1 and 2, an organic light-emitting device (OLED) 20, a thin-film transistor, a wiring pattern, etc. are formed on a substrate 10 (operation S1).

The shapes and materials of the OLED 20, the thin-film transistor, the wiring pattern, etc. can be diversely modified. The exemplary shapes of the OLED 20, the thin-film transistor, and the wiring pattern will be described below with reference to FIG. 9.

Referring to FIGS. 1 and 3, a first encapsulation layer 30 having a first thin-film density and containing a first inorganic material is formed on the substrate 10 (operation S2).

Referring to FIGS. 1 and 4, a second encapsulation layer 40 having a second thin-film density which is higher than the first thin-film density and containing a second inorganic material is formed on the first encapsulation layer 30, thereby completing an organic light-emitting display 1 according to the current exemplary embodiment (operation S3).

Specifically, the first inorganic material and the second inorganic material may be the same material, such as, for example, may be $Al_2O_3$ or $TiO_2$.

The first encapsulation layer 30 and the second encapsulation layer 40 may be formed successively within the same equipment. The first encapsulation layer 30 and the second encapsulation layer 40 may be formed by atomic layer deposition (ALD). For example, ALD equipment using remote plasma may be utilized to form the first encapsulation layer 30 and the second encapsulation layer 40. The ALD equipment using remote plasma generates plasma outside its chamber and injects the generated plasma into the chamber. If the first encapsulation layer 30 and the second encapsulation layer 40 are formed within the same equipment, the number of chambers required for the process can be reduced, and the processing time can be reduced.

Specifically, the substrate 10 having the OLED 20 is placed within the chamber of the ALD equipment, and then the first encapsulation layer 30 and the second encapsulation layer 40 are formed successively. Low-energy plasma may be used to form the first encapsulation layer 30, and high-energy plasma may be used to form the second encapsulation layer 40. To adjust the energy, the level or frequency of power used to form plasma may be adjusted.

The first encapsulation layer 30 may be formed by an ALD method using first plasma generated based on a first energy, and the second encapsulation layer 40 may be formed by an ALD method using second plasma generated based on a second energy which is higher than the first energy. For example, the first plasma may be generated using a first power at a first level, and the second plasma may be generated using a second power at a second level which is higher than the first level. The first plasma may be generated using a first power of a first frequency, and the second plasma may be generated using a second power of a second frequency which is higher than the first frequency.

The second encapsulation layer 40 prevents impurities, such as $O_2$, $H_2$ and $H_2O$, from affecting the OLED 20. To block the impurities, the second encapsulation layer 40 may have a thin-film density higher than a predetermined thin-film density. If the second encapsulation layer 40 were to be formed directly on the OLED 20 using high-energy plasma, the OLED 20 may be adversely affected. For this reason, the first encapsulation layer 30 is first formed on the OLED 20 using low-energy plasma. The first encapsulation layer 30 not only blocks impurities, such as $O_2$, $H_2$ and $H_2O$, but also protects the OLED 20 against high-energy plasma. In addition, the absence of an encapsulation substrate prevents an increase in product price and reduces the damage to the OLED 20 during the fabrication process.

If necessary, the first encapsulation layer 30 and the second encapsulation layer 40 can be formed using different pieces of equipment. For example, the first encapsulation layer 30 may be formed with ALD equipment using remote plasma, and the second encapsulation layer 40 may be formed with ALD equipment using direct plasma. The ALD equipment using direct plasma generates plasma within its chamber and uses the generated plasma.

The ALD equipment using remote plasma will be described below with reference to FIG. 7, and the ALD equipment using direct plasma will be described below with reference to FIG. 8.

Figure 5:
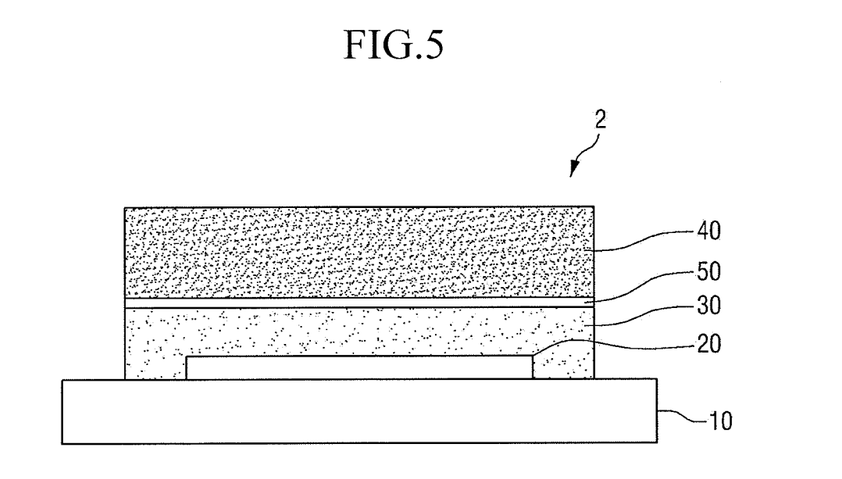
FIG. 5 is a diagram for explaining a method of fabricating an organic light-emitting display and an organic light-emitting display according to another exemplary embodiment.

FIG. 5 is a diagram for explaining a method of fabricating an organic light-emitting display and an organic light-emitting display according to another exemplary embodiment. For simplicity, a description of elements and features described above with reference to FIGS. 1 through 4 will not be repeated below.

Referring to FIG. 5, an organic light-emitting display 2 according to the current exemplary embodiment includes a stress release layer 50 formed between a first encapsulation layer 30 and a second encapsulation layer 40.

A first thin-film density of the first encapsulation layer 30 is low, and a second thin-film density of the second encapsulation layer 40 is high. Accordingly, stress may be created between the first encapsulation layer 30 and the second encapsulation layer 40. This stress can reduce the adhesion between the first encapsulation layer 30 and the second encapsulation layer 40. The stress release layer 50 releases the stress, thereby increasing the adhesion between the first encapsulation layer 30 and the second encapsulation layer 40.

The stress release layer 50 may be an organic layer, such as a layer including ethylene glycol.

The stress release layer 50 may be formed by, e.g., molecular layer deposition (MLD). A thickness of the stress release layer 50 may be, but is not limited to, several Å.

Figure 6:
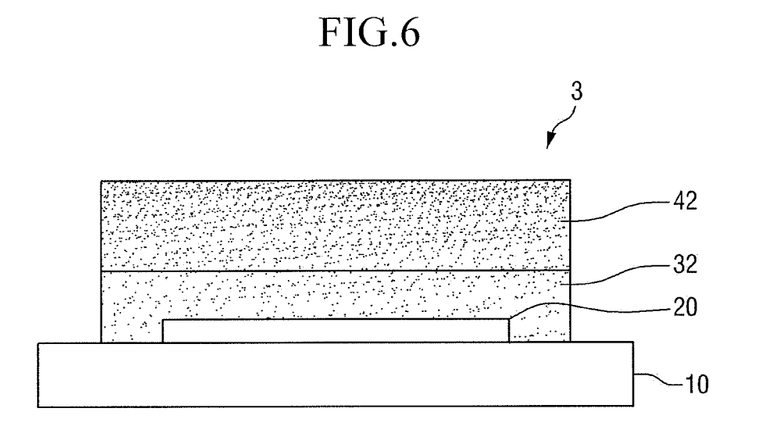
FIG. 6 is a diagram for explaining a method of fabricating an organic light-emitting display and an organic light-emitting display according to another exemplary embodiment.

FIG. 6 is a diagram for explaining a method of fabricating an organic light-emitting display and an organic light-emitting display according to another exemplary embodiment. For simplicity, a description of elements and features described above with reference to FIGS. 1 through 4 will be omitted below.

Referring to FIG. 6, a first thin-film density of a first encapsulation layer 32 or a second thin-film density of a second encapsulation layer 42 included in an organic light-emitting display 3 according to the current exemplary embodiment may not be constant.

Specifically, the first thin-film density and the second thin-film density may increase as the distance from an OLED 20 increases.

Alternatively, the first thin-film density may increase as the distance from the OLED 20 increases, and the second thin-film density may remain constant regardless of the distance from the OLED 20.

Alternatively, the first thin-film density may remain constant regardless of the distance from the OLED 20, and the second thin-film density may increase as the distance from the OLED 20 increases.

The energy of plasma of ALD equipment may be adjusted to control the first thin-film density and the second thin-film density. For example, when plasma of ALD equipment is generated, if the level of power is sequentially increased or if the frequency of the power is sequentially increased, a thin-film density gradually increases.

ALD equipment that can be used in some embodiments will now be described with reference to FIGS. 7 and 8.

Figure 7:
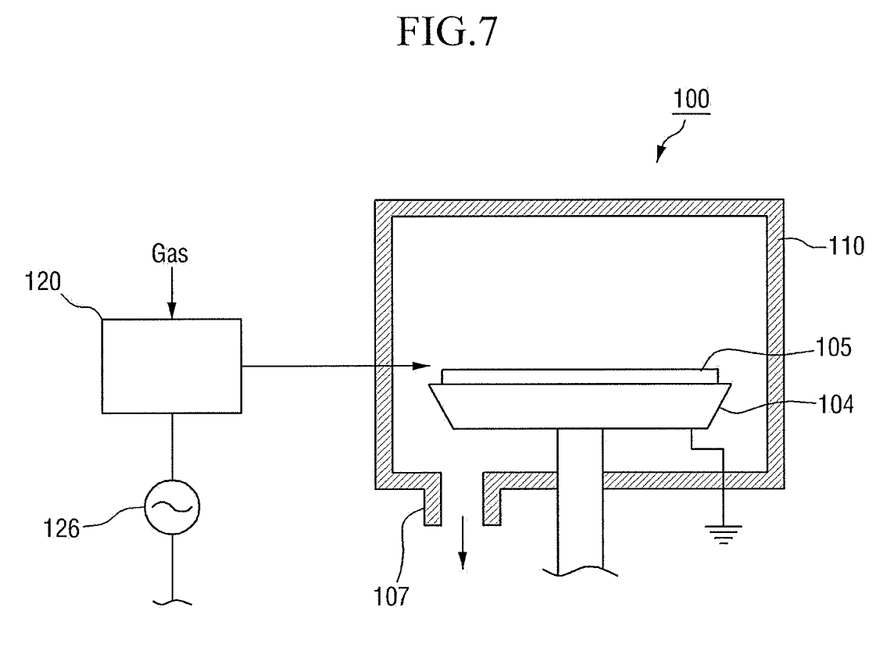
FIG. 7 is a conceptual diagram of atomic layer deposition (ALD) equipment using remote plasma.

FIG. 7 is a conceptual diagram of ALD equipment 100 using remote plasma.

Referring to FIG. 7, the ALD equipment 100 using remote plasma includes a wafer support 104 within a chamber 110. The wafer support 104 on which a wafer 105 is mounted may be installed in a lower part of the chamber 110 and may be electrically grounded. According to present embodiments, the substrate 10 including the OLED 20 formed thereon is used in place of the wafer 105.

A plasma generator 120 is located separate from the chamber 110. The plasma generator 120 is connected to a high-frequency generator 126 which supplies power (e.g., radio-frequency (RF) power). The plasma generator 120 is supplied with a reaction gas and generates plasma using power. In some embodiments, the high-frequency generator 126 may adjust the frequency of power used in the formation of the first encapsulation layer 30 and the second encapsulation layer 40.

Figure 8:
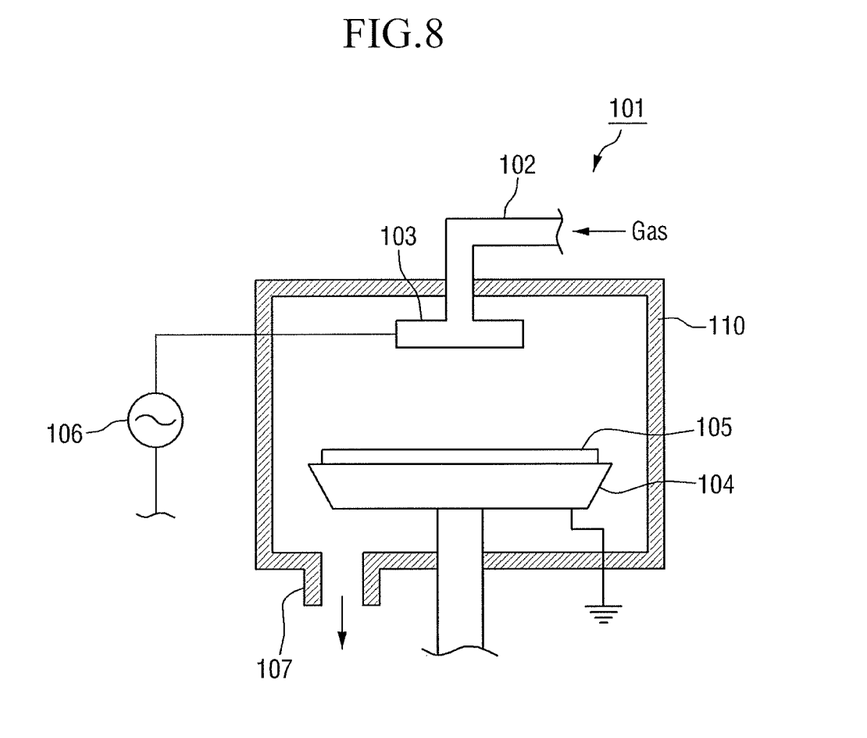
FIG. 8 is a conceptual diagram of ALD equipment using direct plasma.

FIG. 8 is a conceptual diagram of ALD equipment 101 using direct plasma.

Referring to FIG. 8, the ALD equipment 101 using direct plasma includes a wafer support 104 within a chamber 110. The wafer support 104 on which a wafer 105 is mounted may be installed in a lower part of the chamber 110 and may be electrically grounded. According to present embodiments, the substrate 10 including the OLED 20 formed thereon is used in place of the wafer 105.

A gas supply pipe 102 is connected to an upper part of the chamber 110 and supplies a reaction gas into the chamber 110. A gas exhaust pipe 107 is connected to the lower part of the chamber 110. A shower head 103 is connected to an end of the gas supply pipe 102 to evenly spread the reaction gas into the chamber 110. The shower head 103 is connected to a high-frequency generator 106 which supplies power (e.g., RF power). The high-frequency generator 106 adjusts the frequency of power. In some embodiments, the high-frequency generator 106 adjusts the frequency of power used in the formation of the second encapsulation layer 40.

In the operation of the ALD equipment 101, the wafer 105 is mounted on the wafer support 104, and then a reaction gas supplied through the gas supply pipe 102 is evenly spread into the chamber 110 by the shower head 103. Next, the high-frequency generator 106 is operated to supply power to the shower head 103. Accordingly, electrons linearly move from the shower head 103 acting as an electrode toward the wafer support 104 acting as an opposite electrode. Here, the reaction gas is ionized by collision with the electrons to become a plasma state in which radicals and the electrons form neutral species. As the radicals existing in the plasma are deposited on the wafer 105, the second encapsulation layer 40 is formed.

Figure 9:
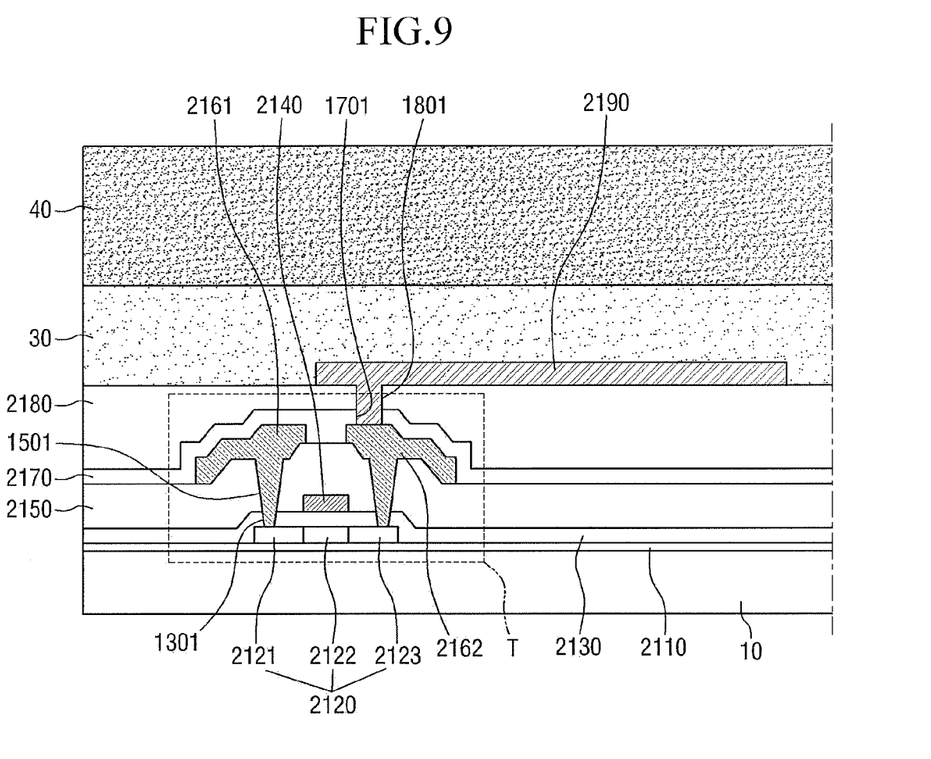
FIG. 9 illustrates a specific example of an organic light-emitting display realized according to an exemplary embodiment.

FIG. 9 illustrates a specific, non-limiting example of an organic light-emitting display realized according to an embodiment. A thin-film transistor, an OLED, a wiring pattern, etc. illustrated in FIG. 9 are mere examples, and the scope is not limited thereto.

Referring to FIG. 9, a buffer layer 2110 is formed on a substrate 10. The buffer layer 2110 prevents impurities of the substrate 10 from diffusing during the formation of an active layer 2120. The buffer layer 2110 may be a silicon nitride layer or a stacked layer of silicon nitride and silicon oxide.

A thin-film transistor T is formed on the buffer layer 2110. The thin-film transistor T includes the active layer 2120, a source electrode 2161, a drain electrode 2162, and a gate electrode 2140 formed on the buffer layer 2110. The active layer 2120 includes a source region 2121, a drain region 2123, and a channel region 2122 connecting the source region 2121 and the drain region 2123.

A gate insulating layer 2130 is formed on the buffer layer 2110 to cover the active layer 2120, and the gate electrode 2140 is formed on the active layer 2120 with the gate insulating layer 2130 interposed therebetween. The gate electrode 2140 may contain any one metal selected from, e.g., MoW, Al, Cr, and Al/Cr. The source electrode 2161 and the drain electrode 2162 may be made of a metal such as Ti/Al or Ti/Al/Ti.

An interlayer insulating film 2150 is formed on the gate insulating layer 2130 to cover the gate electrode 2140.

First contact holes 1301 and second contact holes 1501 are formed in the gate insulating layer 2130 and the interlayer insulating film 2150, respectively. Accordingly, the source region 2121 and the drain region 2123 are exposed through the first contact holes 1301 and the second contact holes 1501, and the source electrode 2161 and the drain electrode 2162 are electrically connected to the exposed source region 2121 and the exposed drain region 2123, respectively.

A passivation layer 2170 and a planarization layer 2180 are sequentially formed on the interlayer insulating film 2150 to cover the thin-film transistor T.

A first via hole 1701 and a second via hole 1801 are formed in the passivation layer 2170 and the planarization layer 2180 to expose a portion of the drain electrode 2162.

A first pixel electrode 2190 is formed on the planarization layer 2180 and is electrically connected to the drain electrode 2162 of the thin-film transistor T by the second via hole 1801.

A first encapsulation layer 30 and a second encapsulation layer 40 are sequentially formed on the first pixel electrode 2190. As described above, the first encapsulation layer 30 may have a first thin-film density and contain a first inorganic material, and the second encapsulation layer 40 may have a second thin-film density higher than the first thin-film density and contain a second inorganic material. The first inorganic material and the second inorganic material may be the same material. The first encapsulation layer 30 and the second encapsulation layer 40 may be formed using the same ALD equipment.

By way of summation and review, a conventional organic light-emitting display includes a substrate having a thin-film transistor, an OLED, a wiring pattern, etc. and an encapsulation substrate bonded to the substrate. The encapsulation substrate prevents impurities, such as $O_2$, $H_2$ and $H_2O$, from affecting the OLED. However, when the substrate having the thin-film transistor, the OLED, the wiring pattern, etc. and the encapsulation substrate are bonded together or when part of the encapsulation substrate is removed, the OLED can be damaged.

According to embodiments described herein, a method of fabricating an organic light-emitting display may be carried out to minimize damage to an organic light-emitting device (OLED) can be minimized. Also, an organic light-emitting display is provided in which the damage to an OLED can be minimized.

Although various embodiments have been described in connection with the exemplary embodiments with reference to the accompanying drawings, it will be apparent to those skilled in the art that various modifications and changes may be made thereto without departing from the scope and spirit of the invention. Therefore, it should be understood that the above embodiments are not limitative, but illustrative in all aspects.

What is claimed is:

1. A method of fabricating an organic light-emitting display, the method comprising:
   forming an organic light-emitting device (OLED) on a substrate;
   forming a first encapsulation layer, which has a first thin-film density and contains a first inorganic material, on the substrate; and
   forming a second encapsulation layer, which has a second thin-film density higher than the first thin-film density and contains a second inorganic material, on the first encapsulation layer,
   wherein:
   the first thin-film density increases through an entirety of the first encapsulating layer as a distance from the OLED increases, or
   the second thin-film density increases through an entirety of the second encapsulating layer as a distance from the OLED increases.

2. The method of claim 1, wherein the first inorganic material and the second inorganic material are the same material.

3. The method of claim 1, wherein the first encapsulation layer and the second encapsulation layer are formed within the same equipment.

4. The method of claim 1, wherein the first encapsulation layer and the second encapsulation layer are formed by an atomic layer deposition (ALD) method.

5. The method of claim 4, wherein the first encapsulation layer is formed by an ALD method using a first plasma generated based on a first energy, and the second encapsulation layer is formed by an ALD method using a second plasma generated based on a second energy that is higher than the first energy.

6. The method of claim 5, wherein the first plasma is generated using a first power at a first level, and the second plasma is generated using a second power at a second level that is higher than the first level.

7. The method of claim 5, wherein the first plasma is generated using a first power of a first frequency, and the second plasma is generated using a second power of a second frequency which is higher than the first frequency.

8. The method of claim 4, wherein the first encapsulation layer is formed by an ALD method using remote plasma, and the second encapsulation layer is formed using remote plasma or direct plasma.

9. The method of claim 1, further comprising forming a stress release layer between the first encapsulation layer and the second encapsulation layer.

10. The method of claim 9, wherein the stress release layer is formed by a molecular layer deposition (MLD) method.

11. The method of claim 1, wherein both the first thin-film density increases through an entirety of the first encapsulating layer and the second thin-film density increases through an entirety of the second encapsulating layer, as a distance from the OLED increases.

12. A method of fabricating an organic light-emitting display, the method comprising:
    placing a substrate having an OLED in a chamber; and
    successively forming a first encapsulation layer and a second encapsulation layer on the OLED,
    wherein the first encapsulation layer is formed by an ALD method using a first plasma generated based on a first energy, and the second encapsulation layer is formed by an ALD method using a second plasma generated based on a second energy that is different from the first energy.

13. The method of claim 12, wherein the first encapsulation layer and the second encapsulation layer are made of the same material.

14. The method of claim 12, wherein the first encapsulation layer and the second encapsulation layer are formed by an ALD method using a remote plasma.

15. An organic light-emitting display comprising:
    a substrate having an OLED;
    a first encapsulation layer on the substrate, having a first thin-film density, and containing a first inorganic material; and
    a second encapsulation layer on the first encapsulation layer, the second encapsulation layer having a second thin-film density which is higher than the first thin-film density, and containing a second inorganic material,
    wherein:
    the first thin-film density increases through an entirety of the first encapsulating layer as a distance from the OLED increases, or
    the second thin-film density increases through an entirety of the second encapsulating layer as a distance from the OLED increases.

16. The display of claim 15, wherein the first inorganic material and the second inorganic material are the same material.

17. The display of claim 15, further comprising a stress release layer between the first encapsulation layer and the second encapsulation layer.

18. The display of claim 15, wherein the first thin-film density increases through an entirety of the first encapsulating layer as a distance from the OLED increases.

* * * * *